US010283613B2

(12) United States Patent
Liu et al.

(10) Patent No.: US 10,283,613 B2
(45) Date of Patent: May 7, 2019

(54) 3D CAPACITOR AND METHOD OF MANUFACTURING SAME

(71) Applicant: Taiwan Semiconductor Manufacturing Company, Ltd., Hsin-Chu (TW)

(72) Inventors: Chi-Wen Liu, Hsinchu (TW); Chao-Hsiung Wang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/891,959

(22) Filed: Feb. 8, 2018

(65) Prior Publication Data

US 2018/0175164 A1    Jun. 21, 2018

Related U.S. Application Data

(62) Division of application No. 13/289,038, filed on Nov. 4, 2011, now Pat. No. 9,893,163.

(51) Int. Cl.
*H01L 29/94* (2006.01)
*H01L 29/66* (2006.01)
*H01L 49/02* (2006.01)

(52) U.S. Cl.
CPC ........ *H01L 29/66181* (2013.01); *H01L 28/92* (2013.01); *H01L 29/94* (2013.01); *H01L 29/945* (2013.01)

(58) Field of Classification Search
None
See application file for complete search history.

(56) References Cited

U.S. PATENT DOCUMENTS

| | | | |
|---|---|---|---|
| 5,266,512 A * | 11/1993 | Kirsch | .................... H01L 28/91 257/E21.019 |
| 5,502,320 A | 3/1996 | Yamada | |
| 6,649,959 B2 | 11/2003 | Hsu et al. | |
| 7,915,693 B2 * | 3/2011 | Okano | .............. H01L 29/66795 257/329 |
| 8,106,459 B2 * | 1/2012 | Chang | ............. H01L 21/823412 257/353 |
| 8,263,462 B2 * | 9/2012 | Hung | ................ H01L 29/66795 438/286 |
| 2005/0077553 A1* | 4/2005 | Kim | ................ H01L 21/823412 257/288 |
| 2005/0224800 A1 | 10/2005 | Lindert et al. | |
| 2007/0221956 A1 | 9/2007 | Inaba | |
| 2007/0259501 A1 | 11/2007 | Xiong et al. | |
| 2008/0029821 A1 | 2/2008 | Yamagami et al. | |
| 2008/0230852 A1* | 9/2008 | Yu | ................... H01L 21/823431 257/401 |

(Continued)

*Primary Examiner* — Bilkis Jahan
(74) *Attorney, Agent, or Firm* — Haynes and Boone, LLP

(57) ABSTRACT

A three-dimensional (3D) capacitor includes a semiconductor substrate; a fin structure including one or more fins formed on the semiconductor substrate; an insulator material formed between each of the one or more fins; a dielectric layer formed on a first portion of the fin structure; a first electrode formed on the dielectric layer; spacers formed on sidewalls of the first electrode; and a second electrode formed on a second portion of the fin structure. The first and second portions are different. The second electrode includes a surface that is in direct contact with a surface of the spacers.

20 Claims, 18 Drawing Sheets

(56) References Cited

U.S. PATENT DOCUMENTS

| | | | |
|---|---|---|---|
| 2008/0265338 A1* | 10/2008 | Yu | H01L 29/66795 257/397 |
| 2009/0057846 A1* | 3/2009 | Doyle | H01L 21/823431 257/623 |
| 2009/0258470 A1 | 10/2009 | Choi et al. | |
| 2009/0321836 A1 | 12/2009 | Wei et al. | |
| 2010/0187656 A1* | 7/2010 | Ke | H01L 29/73 257/586 |
| 2010/0246152 A1 | 9/2010 | Lin et al. | |
| 2011/0079829 A1 | 4/2011 | Lai et al. | |
| 2011/0163393 A1* | 7/2011 | Lander | H01L 29/66795 257/401 |
| 2011/0193141 A1 | 8/2011 | Lin et al. | |
| 2011/0291166 A1 | 12/2011 | Booth, Jr. et al. | |
| 2013/0113072 A1 | 5/2013 | Liu et al. | |

\* cited by examiner

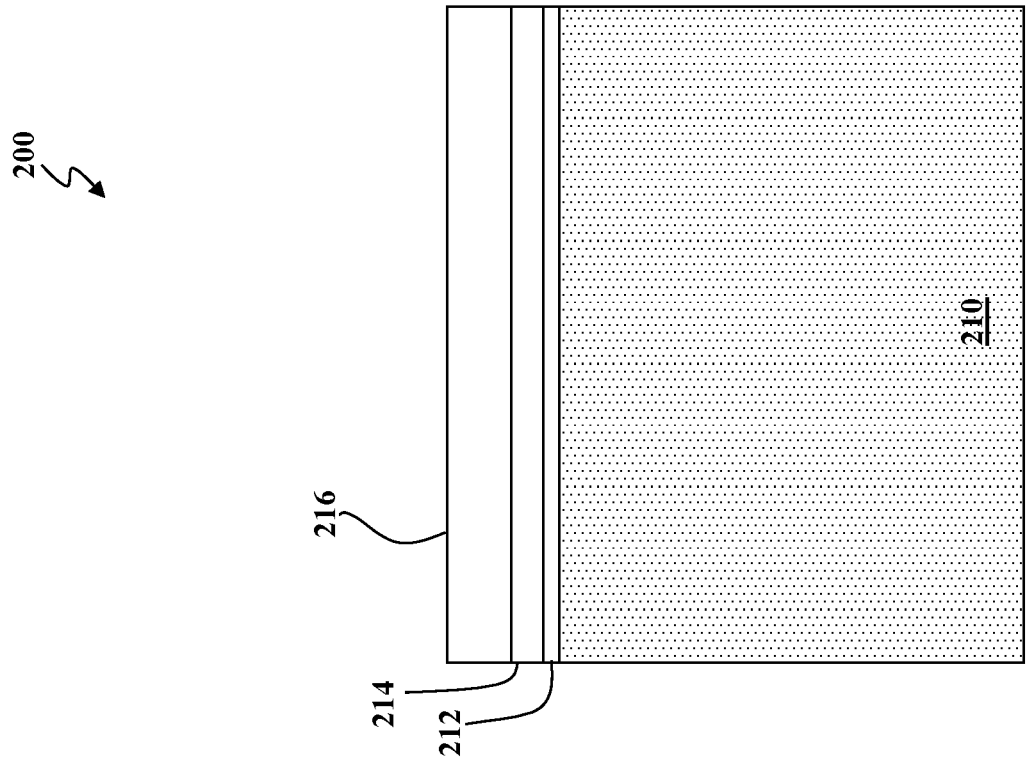
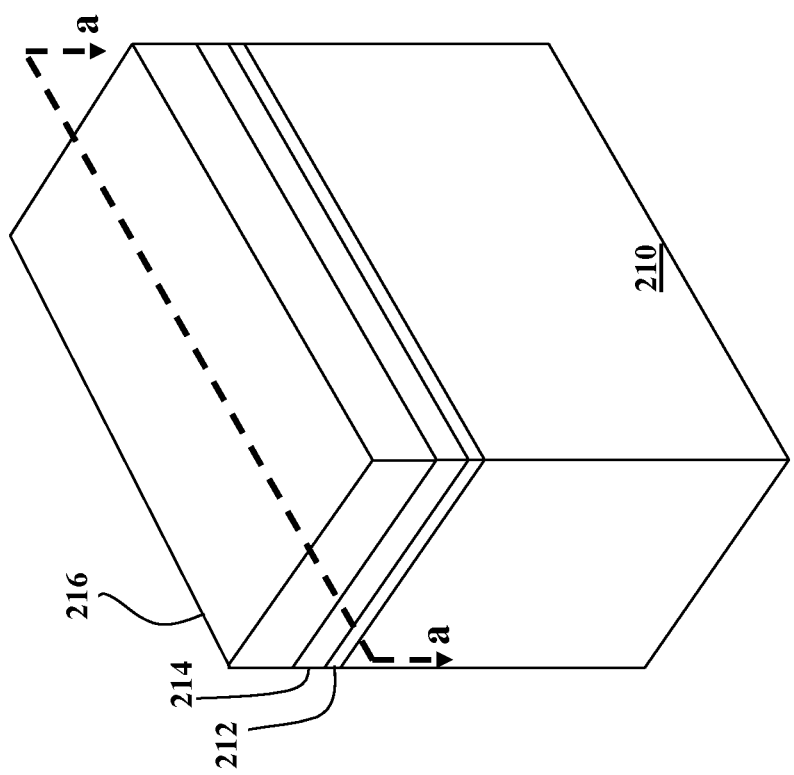
FIG. 2A
FIG. 2B

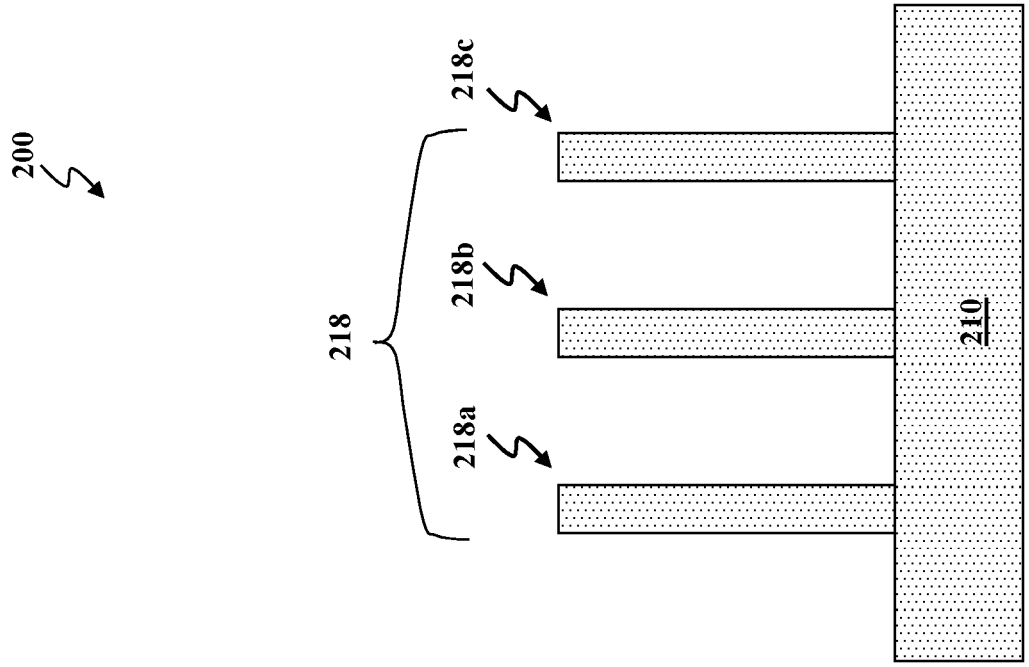
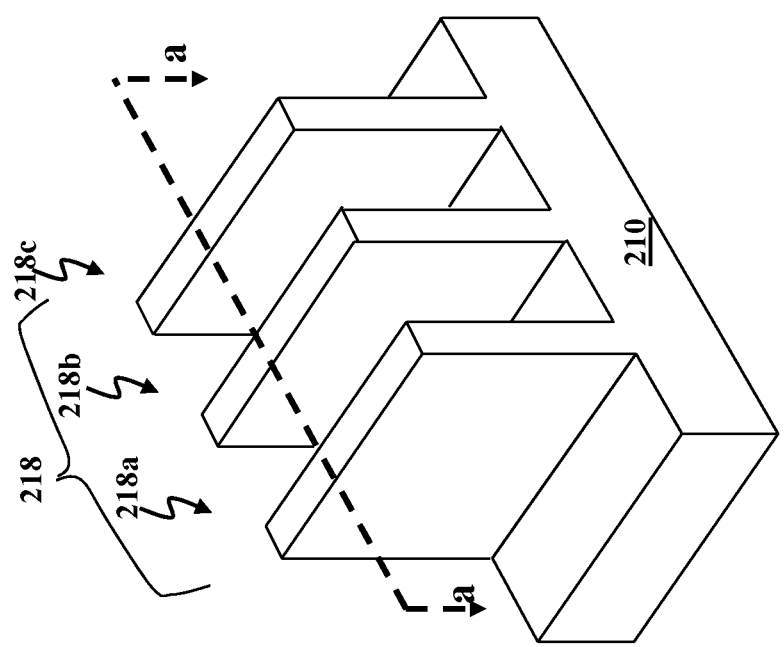
FIG. 4A
FIG. 4B

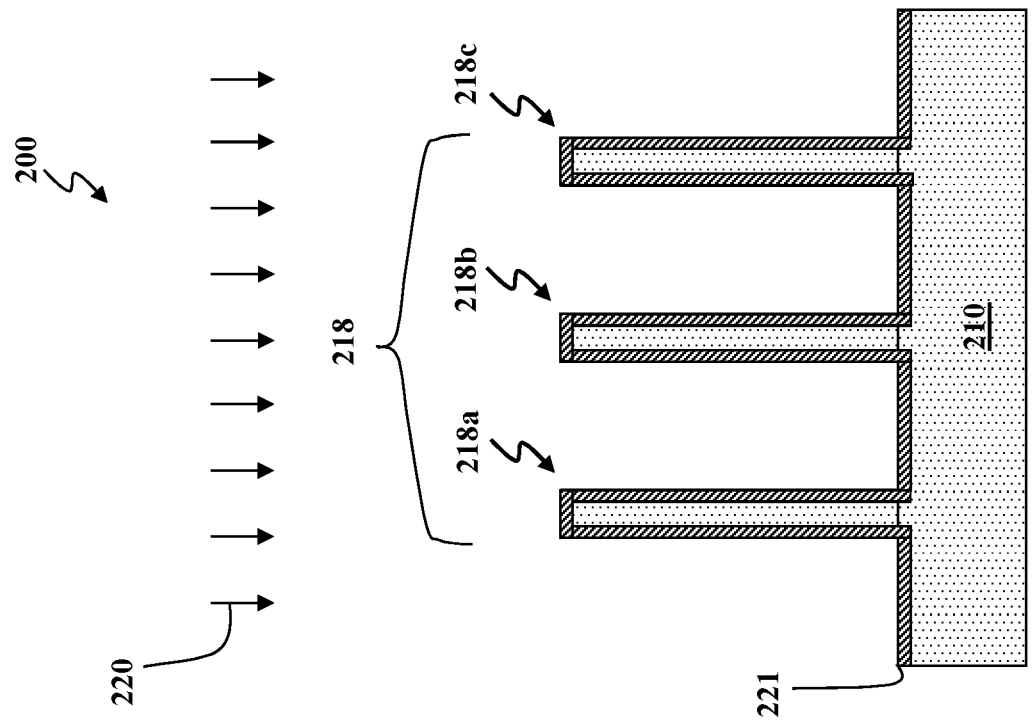
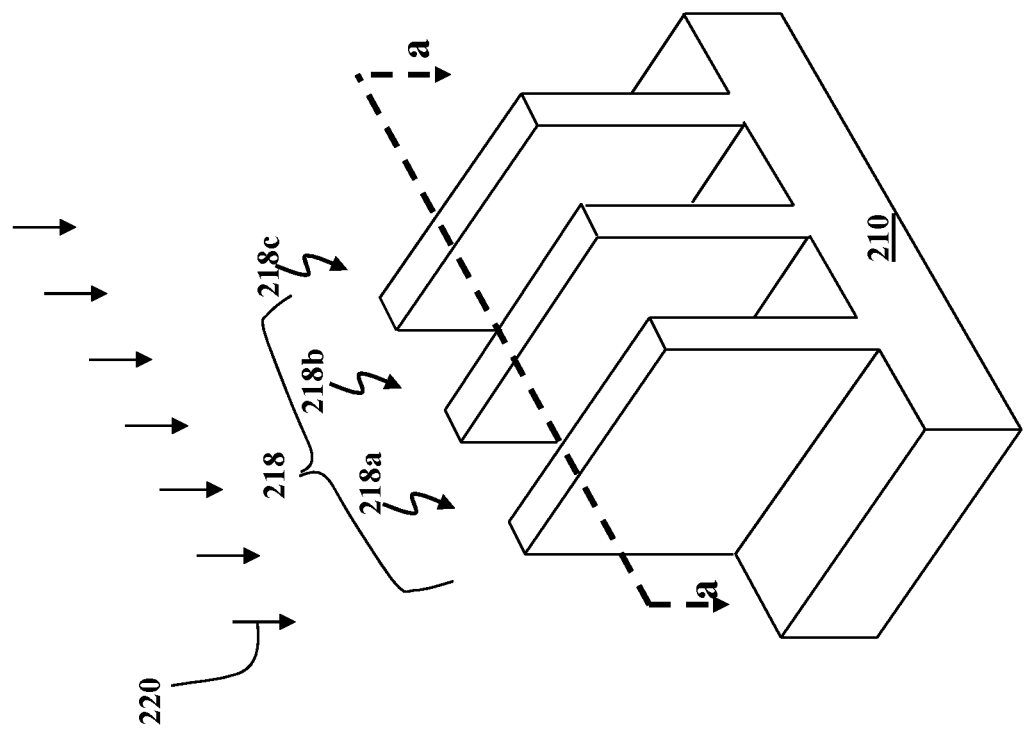
FIG. 5A
FIG. 5B

3D CAPACITOR AND METHOD OF MANUFACTURING SAME

PRIORITY

This is a divisional of U.S. patent application Ser. No. 13/289,038, filed Nov. 4, 2011, the entire disclosure of which is herein incorporated by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of three-dimensional (3D) devices. Along with the development of 3D devices, there is a need for capacitors for the 3D devices. Accordingly, although existing capacitors and methods of fabricating capacitors have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-10A illustrate perspective views of one embodiment of a semiconductor device at various stages of fabrication, according to the method of FIG. 1.

FIGS. 2B-10B illustrate diagrammatic cross-sectional side views of the semiconductor device, in portion or entirety, illustrated in FIGS. 2A-10A, respectively.

FIGS. 12A-18A illustrate perspective views of one embodiment of a semiconductor device at various stages of fabrication, according to the method of FIG. 11.

FIGS. 12B-18B illustrate diagrammatic cross-sectional side views of the semiconductor device, in portion or entirety, illustrated in FIGS. 12A-18A, respectively.

DETAILED DESCRIPTION

Figure 1:
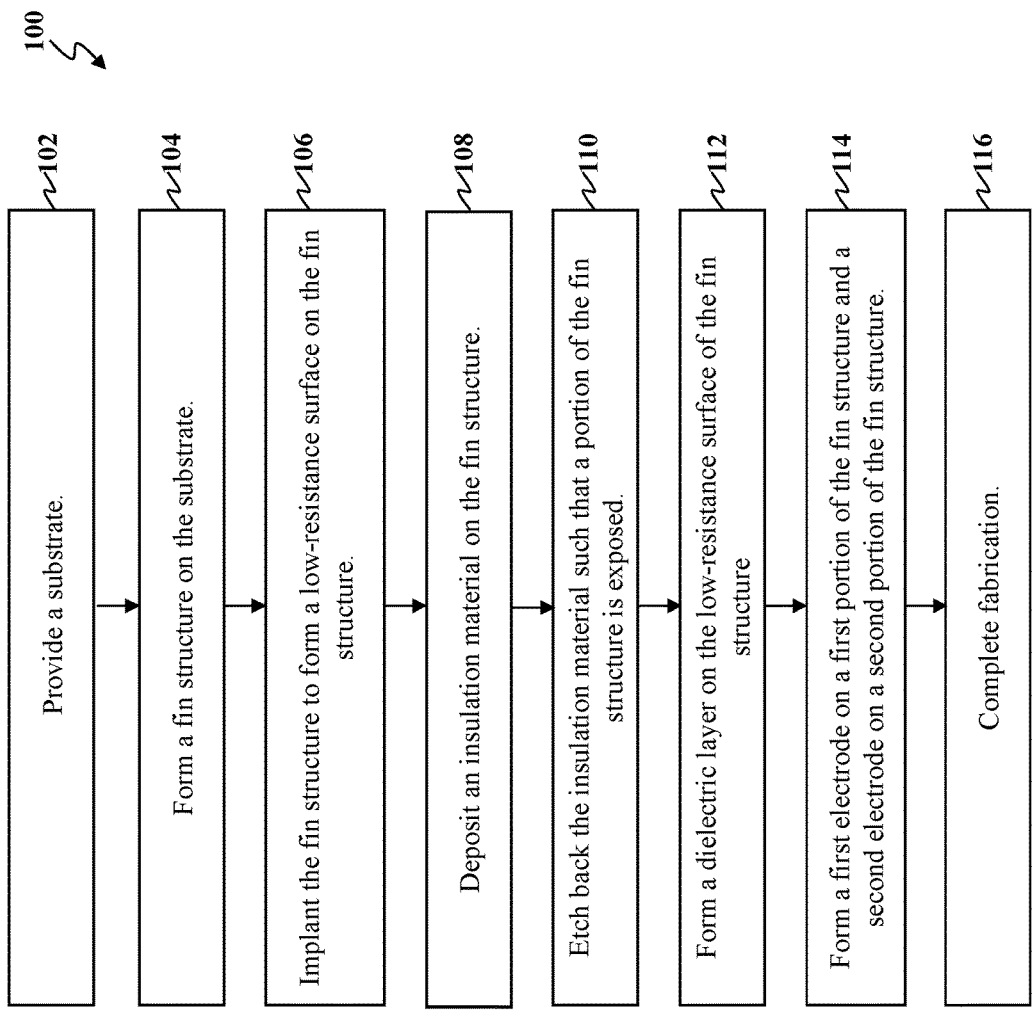
FIG. 1 is a flowchart illustrating a method of fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a capacitor for a three-dimensional (3D) device. The capacitor may be a 3D capacitor such as a metal insulator metal (MIM) or a metal insulator semiconductor (MIS) capacitor. The 3D capacitor, for example, may be used in conjunction with a 3D device such as a fin-like field effect transistor (FinFET) device. The FinFET device, for example, may be a P-type metal-oxide-semiconductor (PMOS) FinFET device or a N-type metal-oxide-semiconductor (NMOS) FinFET device. The following disclosure will continue with a MIM capacitor example for a FinFET device to illustrate various embodiments of the present disclosure. It is understood, however, that the disclosure should not be limited to a particular type of device, except as specifically claimed.

With reference to FIGS. 1 and 2A,B-10A,B, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a 3D capacitor. The method 100 begins at block 102 where a substrate is provided. At block 104, a fin structure is formed over the substrate. The formation of the fin structure may include patterning a mask layer and etching the semiconductor substrate using the mask layer. At block 106, the fin structure is implanted to form a low-resistance surface on the fin structure. The method continues with block 108 where an insulation material is deposited on the fin structure. The insulation material may be deposited such that it covers the fin structure and substantially fills regions between each fin of the fin structure. A planarizing process may be subsequently performed such that the top surface of the dielectric layer is planarized, exposing a top portion of the fin structure. The method continues with block 110 where an etching process is performed on the insulation material such that a portion of the fin structure is exposed. At block 112, a dielectric layer is formed over the low-resistance surface of the fin structure. The method 100 continues with block 114 where a first electrode is formed on a first portion of the fin structure and a second electrode is formed on a second portion of the fin structure. The first and second portions are different. The method 100 continues with block 116 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A-10A illustrate perspective views of one embodiment of a semiconductor device at various stages of fabrication, according to the method of FIG. 1. FIGS. 2B-10B illustrate diagrammatic cross-sectional side views of the semiconductor device, in portion or entirety, illustrated in FIGS. 2A-10A, respectively, taken along line a-a. In the present disclosure, the semiconductor device is a 3D capacitor. The 3D capacitor 200 may be included in a microprocessor, memory cell, and/or other integrated circuit device. FIGS. 2A,B-10A,B have been simplified for the sake of clarity to better understand the concepts of the present disclosure. Additional features can be added in the 3D capacitor 200, and some of the features described below can be replaced or eliminated in other embodiments of the semiconductor device 200.

Referring to FIGS. 2A and 2B, the 3D capacitor 200 includes a substrate (e.g., wafer) 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods.

With further reference to FIGS. 2A and 2B, formed over the substrate 210 is a dielectric layer 212. The dielectric layer 212 is formed by any suitable process to any suitable thickness. In the present embodiment, the dielectric layer 212 includes silicon oxide and is formed by a CVD or a thermal oxidation process. The thermal oxidation process may be a dry or a wet process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Formed over the dielectric layer 212 is a mask layer 214. In the present embodiment, the mask layer 214 includes silicon nitride and is formed by a CVD process. The mask layer 214 may be a stop/hard mask layer. The mask layer 214 is formed by any suitable process to any suitable thickness. The mask layer 214 may include a material such as silicon nitride, silicon oxynitride, silicon carbide, silicon carbon nitride, other suitable material, or combinations thereof. In the present embodiment, the mask layer 214 includes silicon nitride and is formed by a chemical vapor deposition (CVD) process. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Formed over the mask layer 214 is a photoresist layer 216. The photoresist layer 216 is formed by any suitable process to any suitable thickness.

Figure 3B:
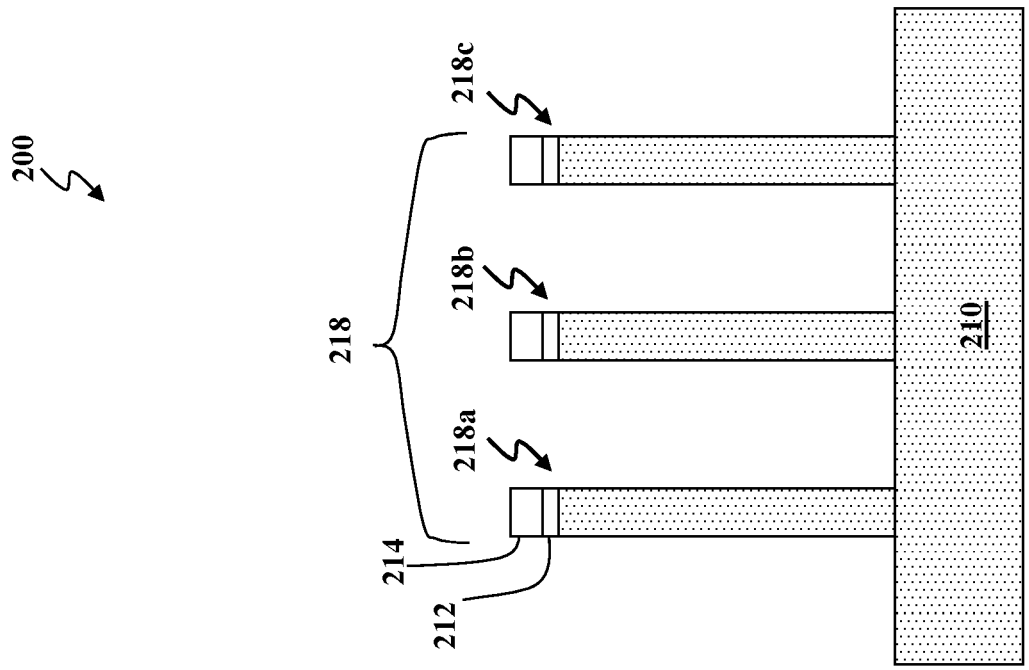
Figure 3A:
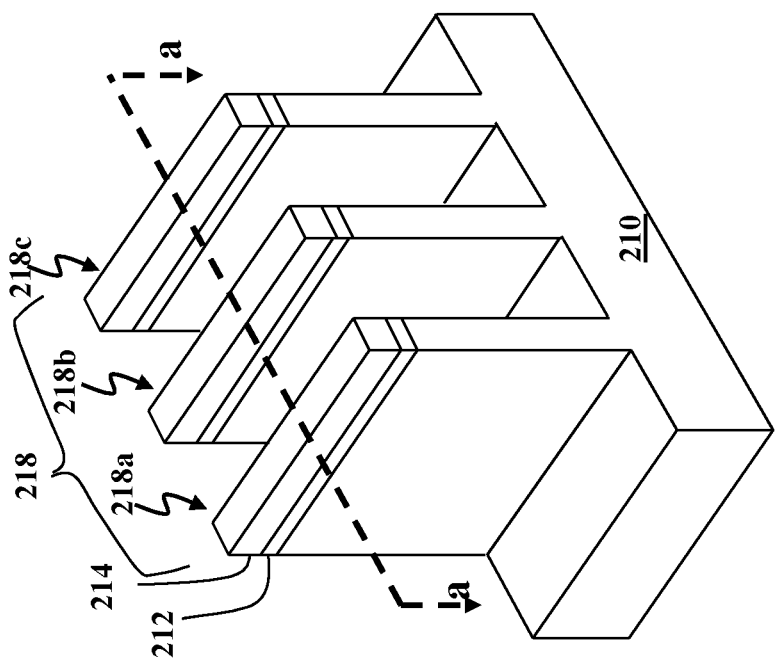

Referring to FIGS. 3A and 3B, fin structure 218 (including a plurality of fins 218a, 218b, and 218c) is formed by any suitable process, such as a photolithography and etching process. For example, in the present embodiment, the fin structure 218 is formed by exposing the photoresist layer 216 to a pattern, performing a post-exposure bake process, and developing the photoresist layer 216 to form a masking element including the photoresist layer 216 and the mask layer 214. The photoresist layer 216 patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. The masking element (including the photoresist layer 216 and the mask layer 214) may then be used in an etching process to etch the fin structure 218 into the substrate 210. The etching process uses the patterned mask layer 214 to define the area to be etched and to protect other regions of the 3D capacitor 200. The etching process may include a wet etching process, a dry etching process, or a combination thereof. The fin structure 218 may be formed by an etching process using a reactive ion etch (RIE) and/or other suitable process. In one example, a hydrofluoric acid (HF) or buffered HF may be used to etch the dielectric layer 212 to expose the substrate 210 according to the pattern defined by the mask layer 214. In one example, a dry etching process used to etch the substrate 210 includes a chemistry including fluorine-containing gas. In furtherance of the example, the chemistry of the dry etch includes CF4, SF6, or NF3. Alternatively, the fin structure 218 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets).

Referring to FIGS. 4A and 4B, the dielectric layer 212 and the mask layer 214 are removed to expose top portions of each fin 218a,b,c, of the fin structure 218. The dielectric layer 212 and the mask layer 214 may be removed by any suitable process. For example, removing the dielectric layer 212 and the mask layer 214 may include a wet etching process, a dry etching process, or a combination thereof.

Referring to FIGS. 5A and 5B, an implantation process 220 is performed on the 3D capacitor 200 to dope/implant the fin structure 218 and thereby form a low-resistance surface 221 on the fin structure 218. The implantation process 220 may include using dopants, such as boron, BF2, phosphorus, arsenic, or any other suitable implantation species to provide for a low-resistance surface 221. In some embodiments, this is accomplished via ion implantation of boron or phosphorous, at an energy between about 5 to 150 KeV, at a dose between about 1E15 to 1E 16 atoms/cm2.

Figure 6B:
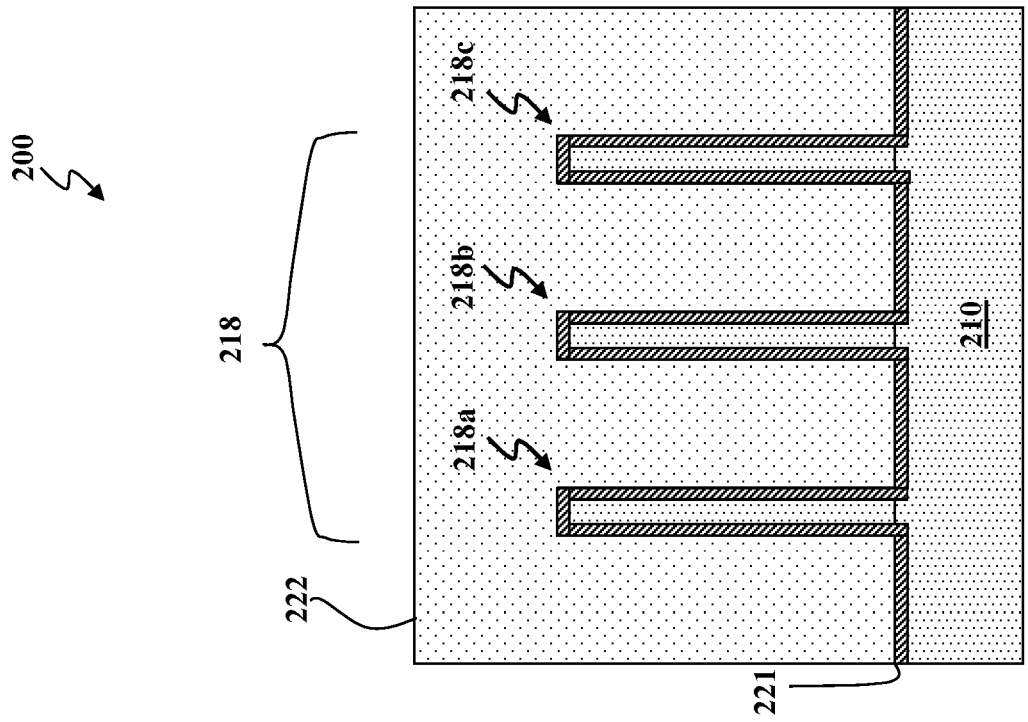
Figure 6A:
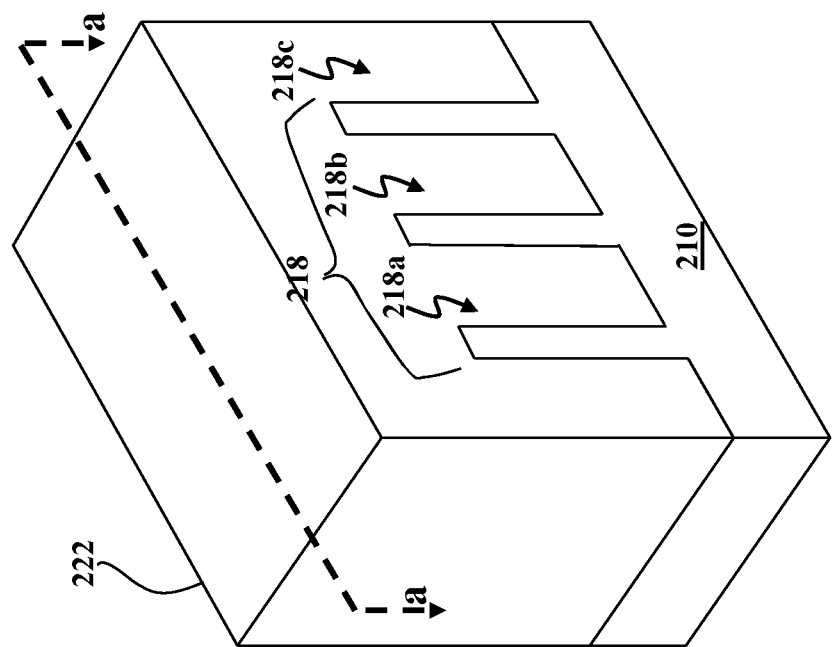

Referring to FIGS. 6A and 6B, deposited over the substrate 210 (and over the low-resistance surface 221 of the fin structure 218) is an insulation material 222. The insulation material 222 is deposited such that the insulation material 222 surrounds and isolates each fin 218a,b,c of the fin structure 218 from other fins. The insulation material 222 may include an insulating material such as silicon oxide, silicon nitride, silicon oxynitride, low k materials, air gap, other suitable material, or combinations thereof. In the present embodiment, the insulation material 222 includes silicon oxide. The silicon oxide can be deposited by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). The insulation material 222 may have a multilayer structure, for example, a thermal oxide liner layer with silicon nitride formed over the liner.

Figure 7B:
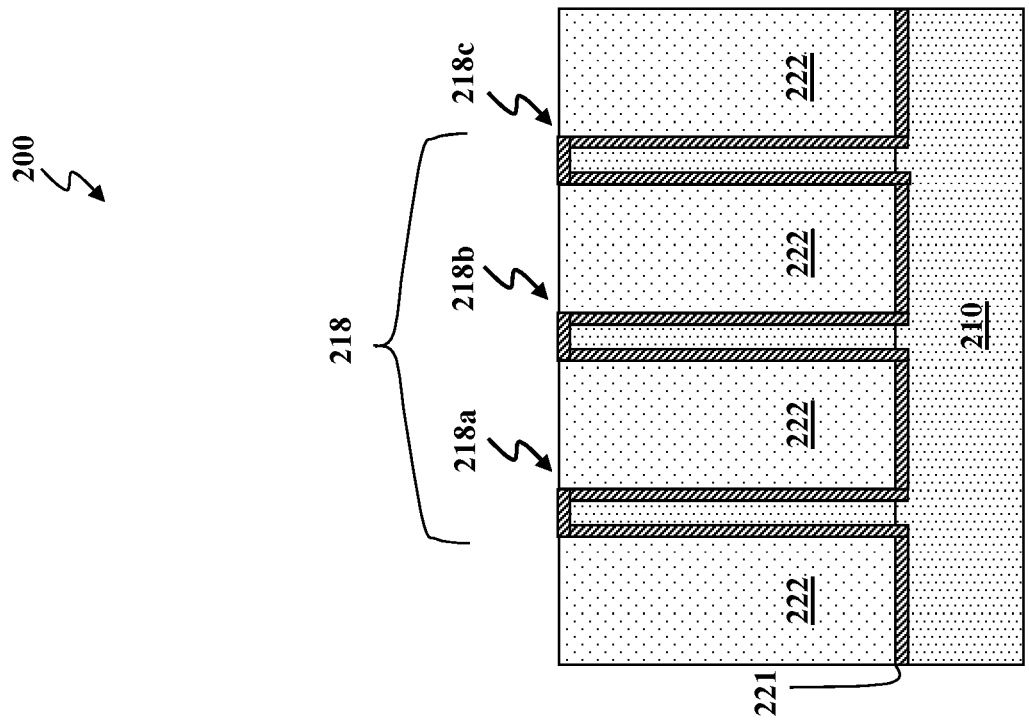
Figure 7A:
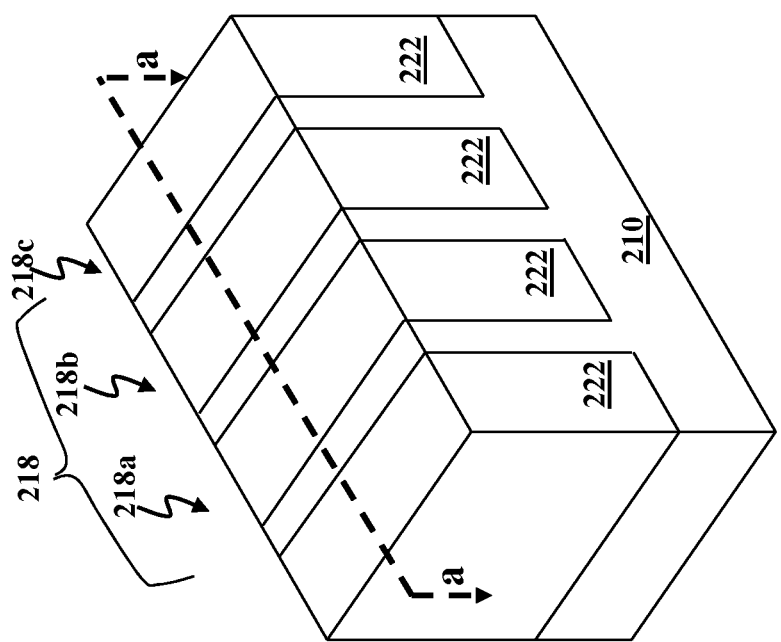

Referring to FIGS. 7A and 7B, a planarizing process is performed on the 3D capacitor 200. In one embodiment, the planarizing process includes a chemical mechanical polishing (CMP) process applied to the 3D capacitor 200 to remove excessive portions of the insulation material 222. The planarizing process may be performed such that the insulation material 222 is removed, thus exposing a top portion of each fin 218a,b,c, of the fin structure 218.

Figure 8B:
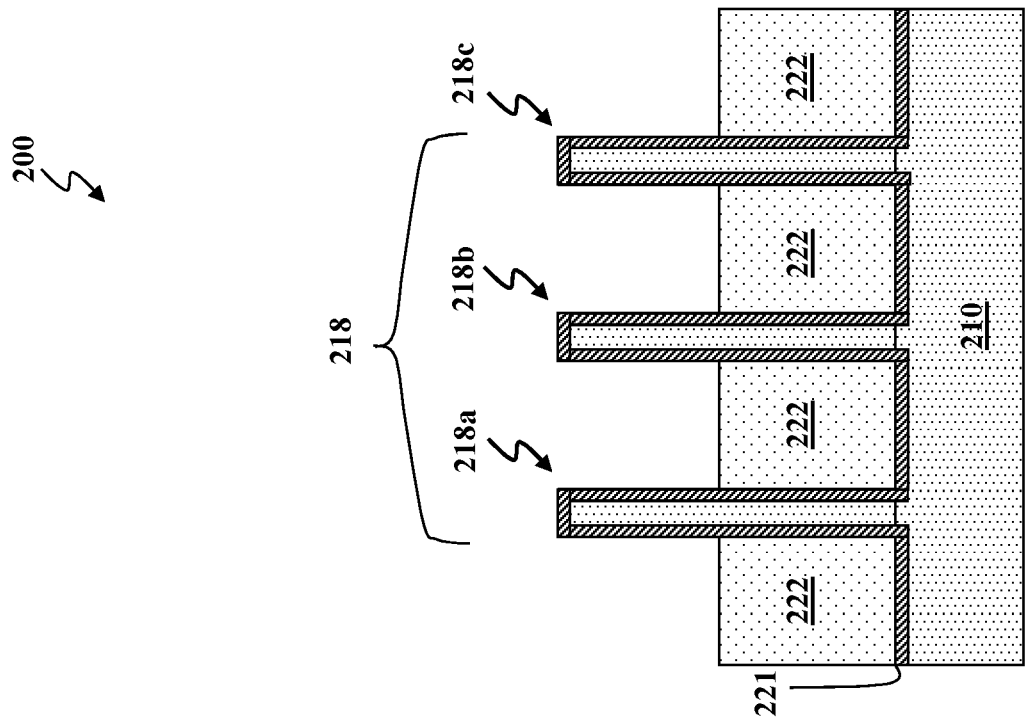
Figure 8A:
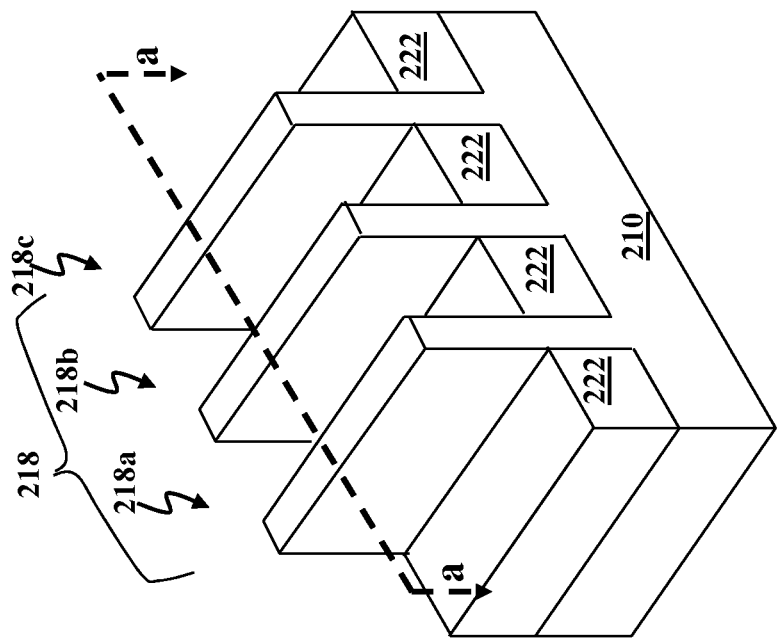

Referring to FIGS. 8A and 8B, an etching process is used to etch-back excessive insulation material 222 between each fin 218a,b,c of the fin structure 218, thereby exposing first and second sidewalls of each fin of the fin structure 218. The etching process may include a wet etching, a dry etching process, or a combination thereof. In one example, the dry etching process used to etch the insulation material 222 may include a chemistry including fluorine-containing gas. In furtherance of the example, the chemistry of the dry etch includes $CF_4$, $SF_6$, or $NF_3$.

Figure 9B:
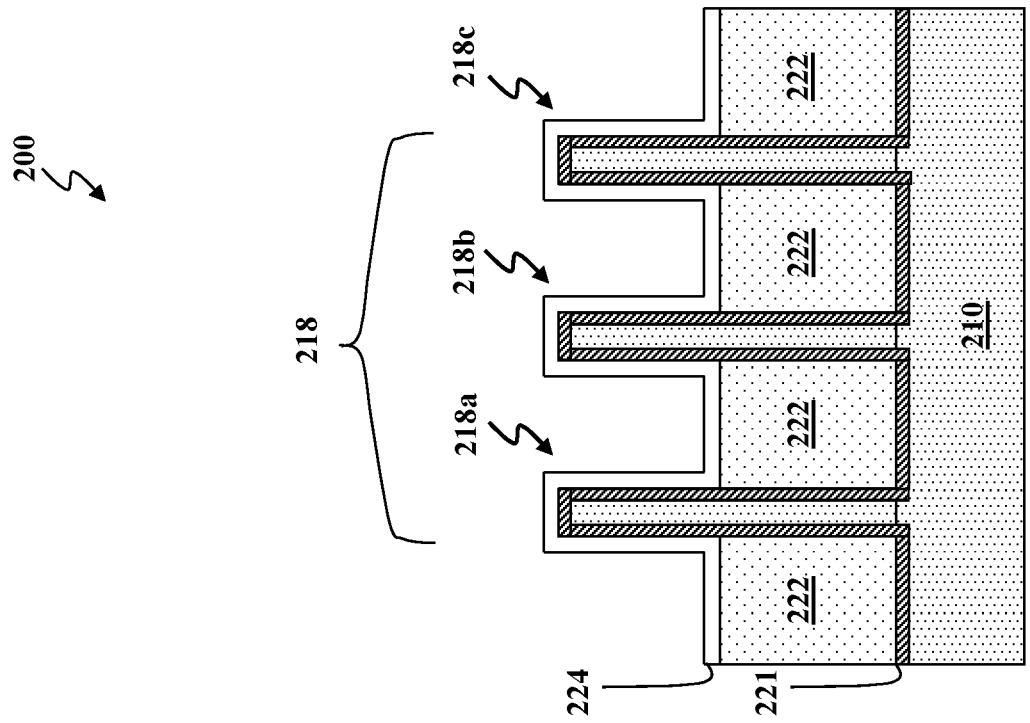
Figure 9A:
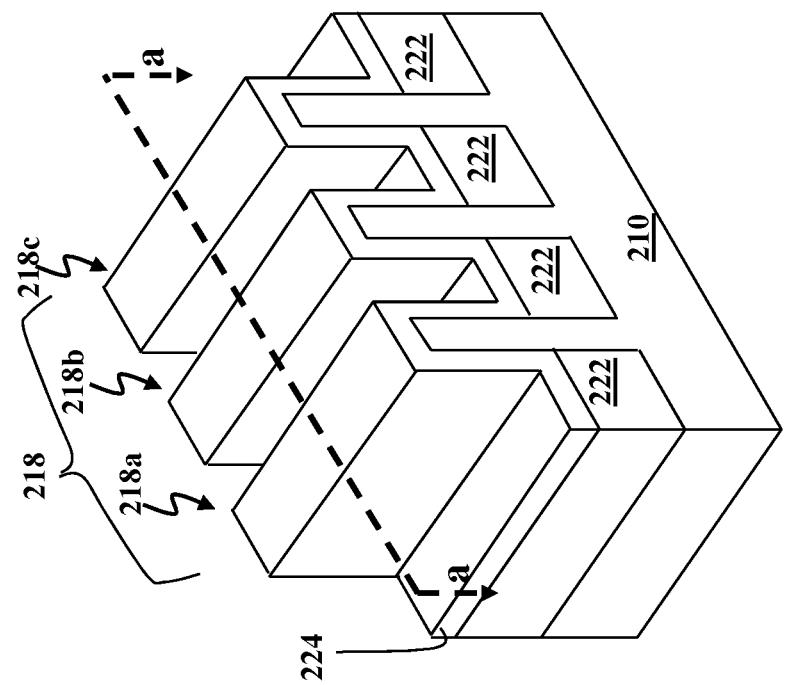

Referring to FIGS. 9A and 9B, the 3D capacitor 200 includes a dielectric layer 224. The dielectric layer 224 traverses the fin structure 218. In some embodiments, the dielectric layer 224 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the dielectric layer 224 is a high-k dielectric layer comprising $HfO_x$. The dielectric layer 224 may be formed using a suitable process such as atomic layer deposition (ALD), chemical vapor deposition (CVD), physical vapor deposition (PVD), thermal oxidation, UV-ozone oxidation, or combinations thereof. The dielectric layer 224 may further comprise an interfacial layer (not shown) to reduce damage between the dielectric layer 224 and the substrate 210 and/or fin structure 218. The interfacial layer may comprise silicon oxide.

Figure 10B:
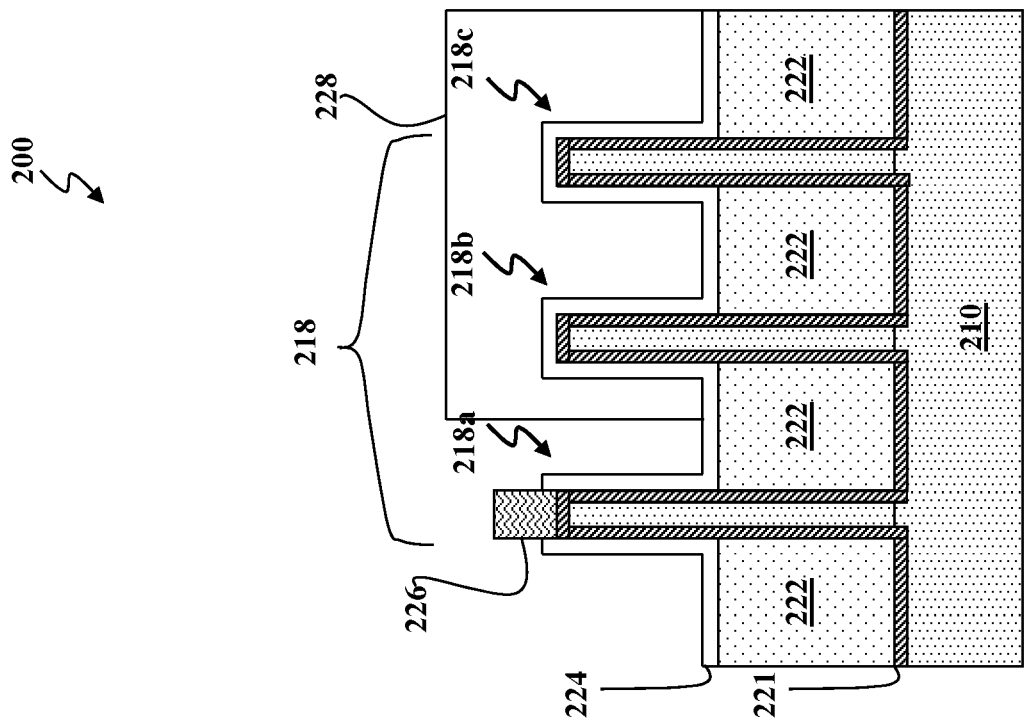
Figure 10A:
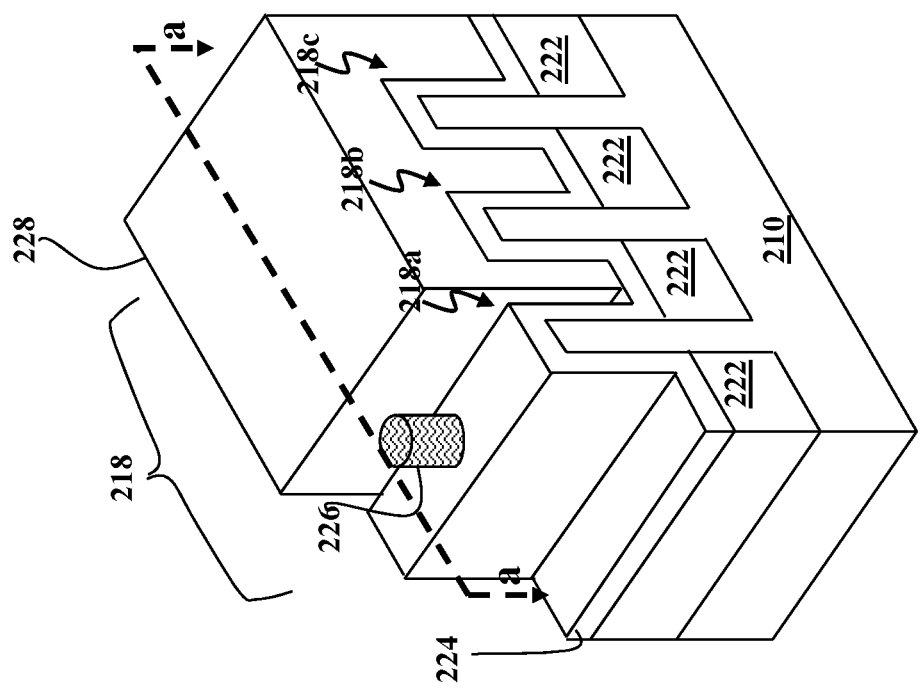

Referring to FIGS. 10A and 10B, the 3D capacitor 200 includes a first electrode 226 formed on a first portion of the fin structure 218 and a second electrode 228 formed on a second portion of the fin structure 218. The first and second portion of fin structure 218 are different. In the illustrated embodiment, the first portion includes a portion of fin 218a and the second portion includes a portion of fins 218b,c. The first electrode 226 and the second electrode 228 include any suitable conductive material. For example, the first and second electrodes 226, 228, include Al, Cu, and W, other conductive materials, or combinations thereof.

The first and second electrodes 226, 228, may be formed by any suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

As illustrated in FIGS. 10A and 10B, the 3D capacitor 200 comprises a substrate 210 including a fin structure 218 including a plurality of fins 218a,b,c. Although the current embodiment illustrates three fins (218a,b,c) more/less fins are contemplated. The substrate 210 and the fin structure 218 includes a low-resistance surface 221. The low-resistance surface 221 is formed on the top portion/layer of the substrate 210 and the fin structure 218. Further, the low-resistance surface 221 is formed on the sidewalls of each fin 218a,b,c, of the fin structure 218. The 3D capacitor 200 further includes an insulating material 222 disposed in a region between each fin 218a,b,c of the fin structure 218 and on the low-resistance surface 221. Formed over the fin structure 218 and the low-resistance surface 221 is a dielectric layer 224. The dielectric layer 224 traverses each fin 218a,b,c of the fin structure 218. Formed over the dielectric layer 224 is a first electrode 226. The first electrode 226 is formed in a central region of at least one fin (e.g., 218a) of the fin structure 218. In the illustrated embodiment, the first electrode 226 is in direct contact with the low-resistance surface 221 of the first fin (e.g., 218a) which underlies the first electrode 226 such that a current can pass between the first electrode 226 and the fin structure 218 through the low-resistance surface 221. Formed on a second portion of the fin structure 218 is a second electrode 228. The second electrode 228 is formed on the dielectric layer 224 thereby being isolated from the fin structure 218. The second electrode 228 is formed along the length of fins 218b,c, on a second portion of the fin structure 218 and traverses the fin structure 218. In the illustrated embodiment, the second electrode 228 is also formed on the dielectric layer 224 in the region between the fins 218a,b,c, of the fin structure 218. In the illustrated embodiment, the first and second electrodes 226, 228 are formed such that they do not have one fin of the fin structure 218 in common. The first and second electrodes 226, 228 are isolated one from the other.

The embodiment of FIGS. 10A and 10B provides for a metal insulator semiconductor (MIS) capacitor. As illustrated, the first electrode 226 provides connectivity to the substrate 210 including the fin structure 218 through the low-resistance surface 221. The substrate 210 including the fin structure 218 (having the low-resistance surface 221) being separated by the dielectric layer 224 from the second electrode 228 provides for a MIS capacitor. It is understood that although the 3D capacitor 200 is illustrated in the present embodiment of FIGS. 10A and 10B includes only three fins, the 3D capacitor 200 may include any number of one or more fins, depending upon design requirements. Further, it is understood that although in the illustrated embodiment the first electrode is formed on only one fin, the first electrode may be formed on more than one fin, depending on design requirements.

Figure 11:
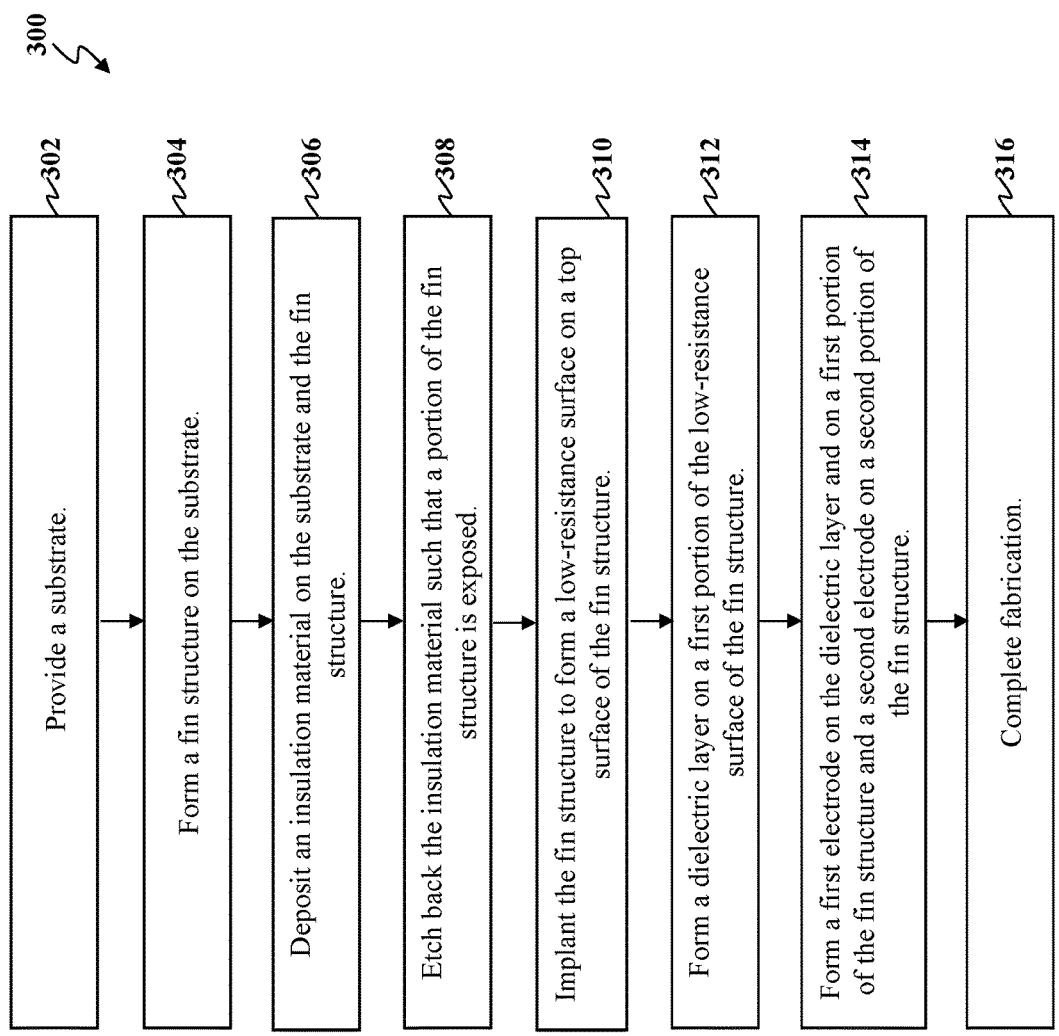
FIG. 11 is a flowchart illustrating a method of fabricating a semiconductor device according to various aspects of the present disclosure.

Referring to FIG. 11, a method 300 for fabricating a semiconductor device is described according to various aspects of the present disclosure. The embodiment of method 300 may include similar process steps as an embodiment of the method 100 which is disclosed above. In disclosing the embodiment of method 300, some details regarding processing and/or structure may be skipped for simplicity if they are similar to those described in the embodiment of method 100.

In the present embodiment, the method 300 is for fabricating an integrated circuit device that includes a 3D capacitor. The method 300 begins at block 302 where a substrate is provided. At block 304, a fin structure is formed over the substrate. The formation of the fin structure may include patterning a mask layer and etching the semiconductor substrate using the mask layer. At block 306, an insulation material is deposited on the fin structure. The insulation material may be deposited such that it covers the fin structure and substantially fills regions between each fin of the fin structure. A planarizing process may be subsequently performed such that the top surface of the dielectric layer is planarized, exposing a top portion of the fin structure. The method continues with block 308 where an etching process is performed on the insulation material such that a portion of the fin structure is exposed. At block 310, the fin structure is implanted to form a low-resistance surface on the fin structure. At block 312, a dielectric layer is formed over the low-resistance surface of the fin structure. The method 300 continues with block 314 where a first electrode is formed on a first portion of the fin structure and a second electrode is formed on a second portion of the fin structure. The first and second portions are different. The method 300 continues with block 316 where fabrication of the integrated circuit device is completed. Additional steps can be provided before, during, and after the method 300, and some of the steps described can be replaced or eliminated for other embodiments of the method. The discussion that follows illustrates various embodiments of an integrated circuit device that can be fabricated according to the method 300 of FIG. 11.

Figure 12B:
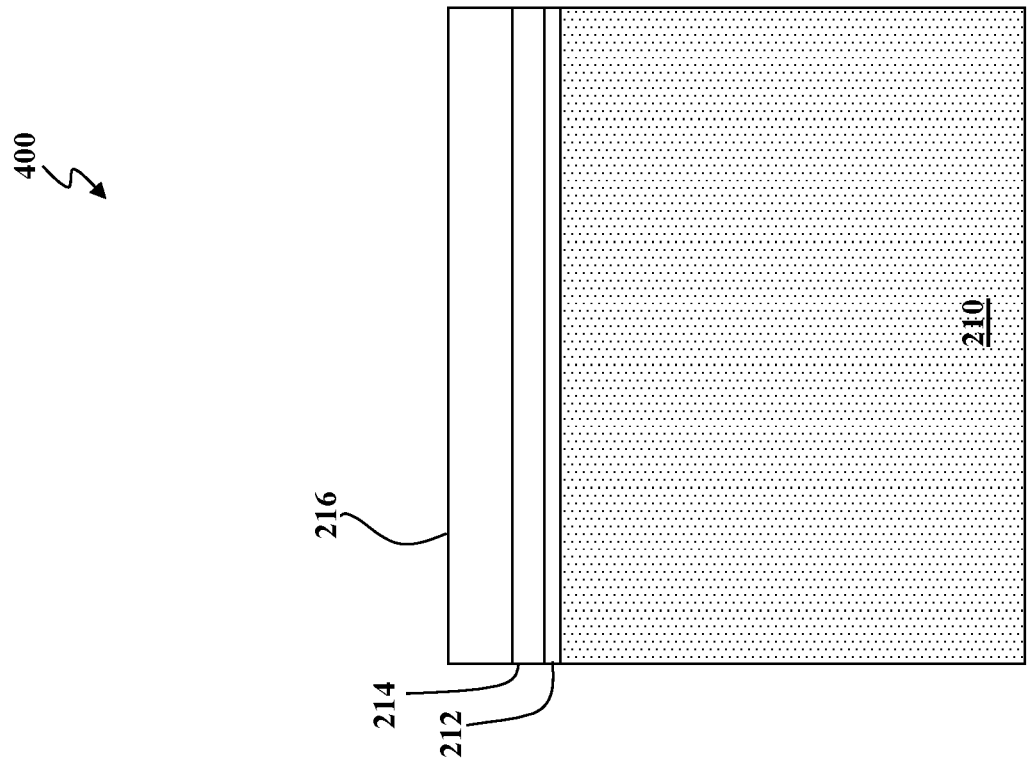
Figure 12A:
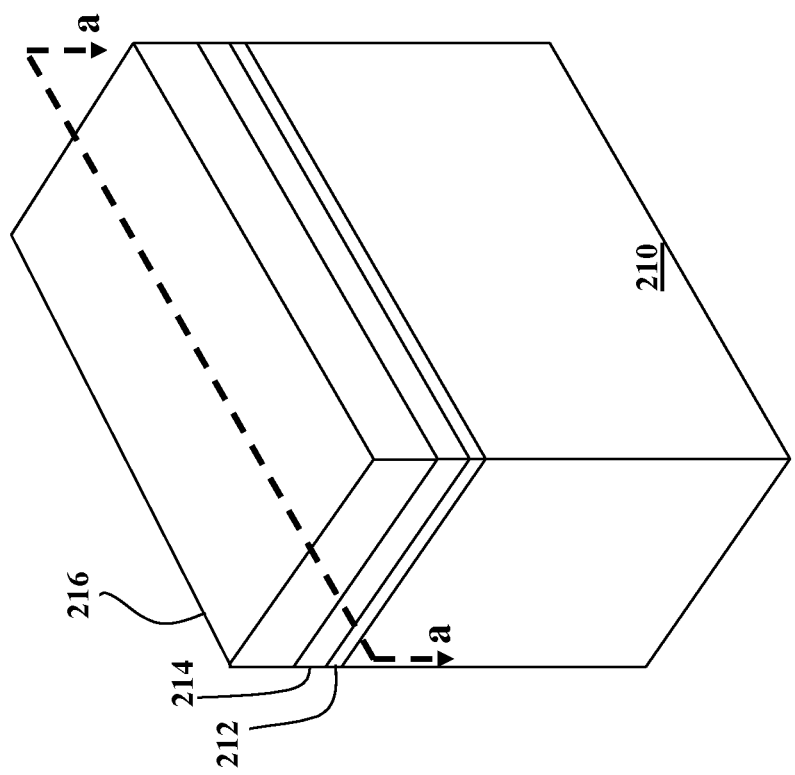

FIGS. 12A,B-18A,B illustrate diagrammatic cross-sectional side views of one embodiment of a semiconductor device 400 at various stages of fabrication according to the method 300 of FIG. 11. The semiconductor device 400 of FIGS. 12A,B-18A,B is similar in certain respects to the semiconductor device 200 of FIGS. 2A,B-10A,B. Accordingly, similar features in FIGS. 2A,B-10A,B and FIGS. 12A,B-18A,B are identified by the same reference numerals for clarity and simplicity.

Referring to FIGS. 12A and 12B, the 3D capacitor 400 includes a substrate 210. In the present embodiment, the substrate 210 defined in the 3D capacitor 400 is substantially similar to the substrate 210 of the 3D capacitor 200 in terms of composition, formation and configuration. In an alternative embodiment, they are different. With further reference to FIGS. 12A and 12B, the 3D capacitor 400 also includes a dielectric layer 212, a mask layer 214, and a photoresist layer 216. In the present embodiment, the dielectric layer 212, the mask layer 214, and the photoresist layer 216 defined in the 3D capacitor 400 are substantially similar to the dielectric layer 212, the mask layer 214, and the photoresist layer 216 of the 3D capacitor 200 in terms of composition, formation and configuration. In an alternative embodiment, they are different.

Figure 13B:
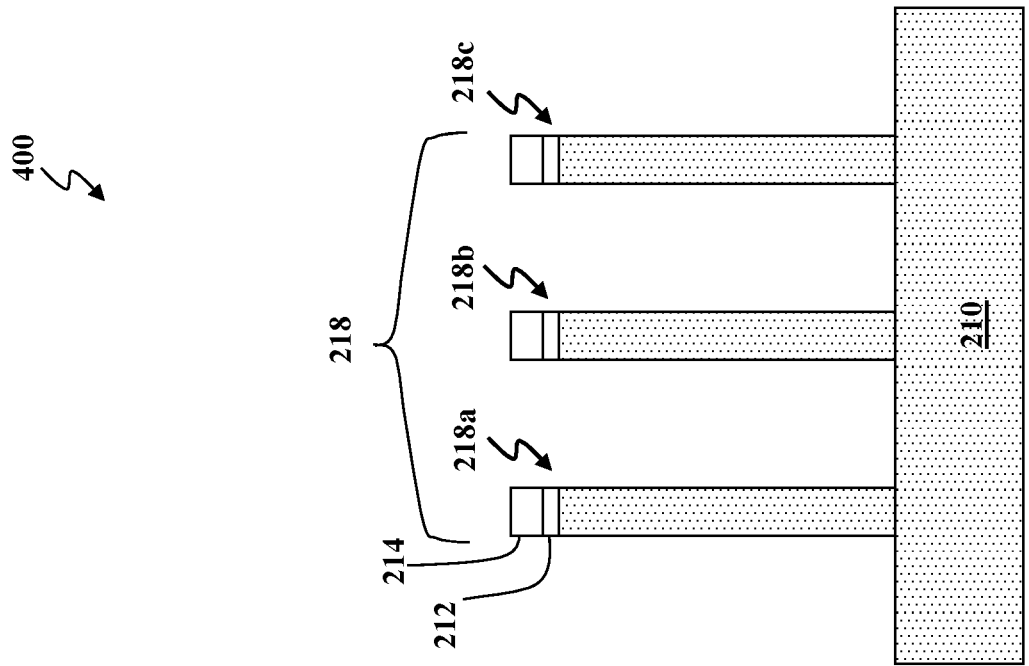
Figure 13A:
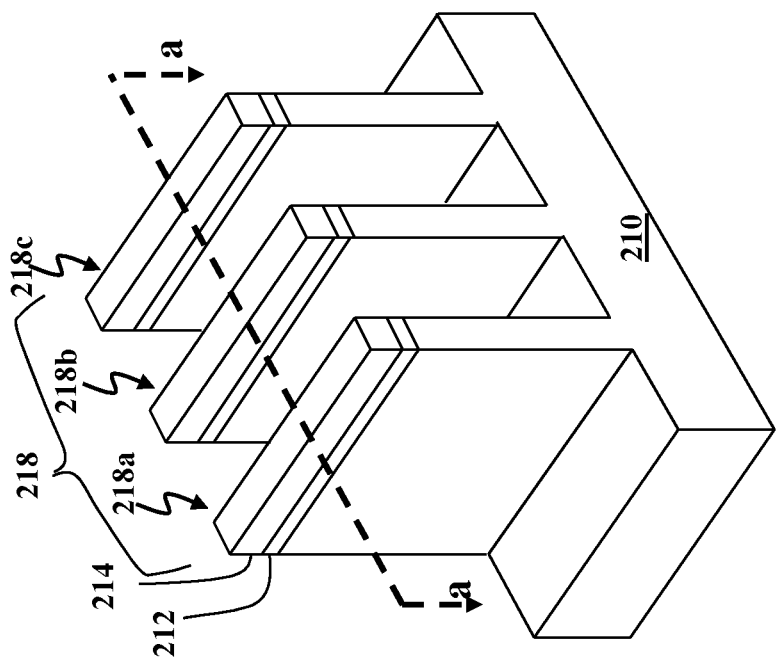

Referring to FIGS. 13A and 13B, fin structure 218 (including a plurality of fins 218a, 218b, and 218c) is formed by any suitable process, such as a photolithography and etching process. In the present embodiment, the process that forms fin structure 218 of 3D capacitor 400 is substantially similar to the process that forms the fin structure 218 of 3D capacitor 200. In an alternative embodiment, they are different.

Figure 14B:
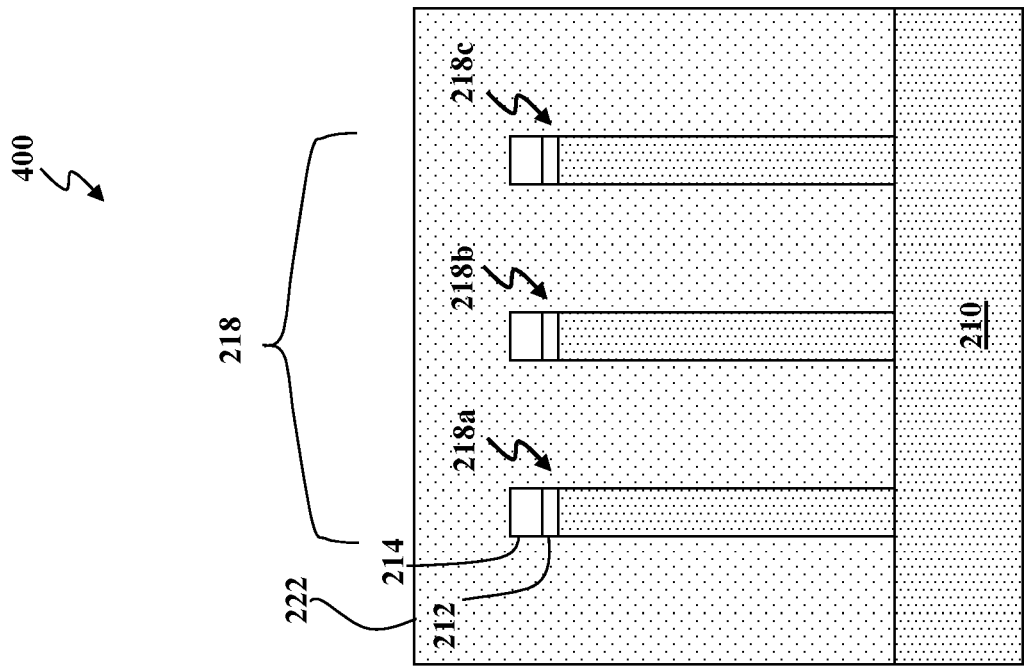
Figure 14A:
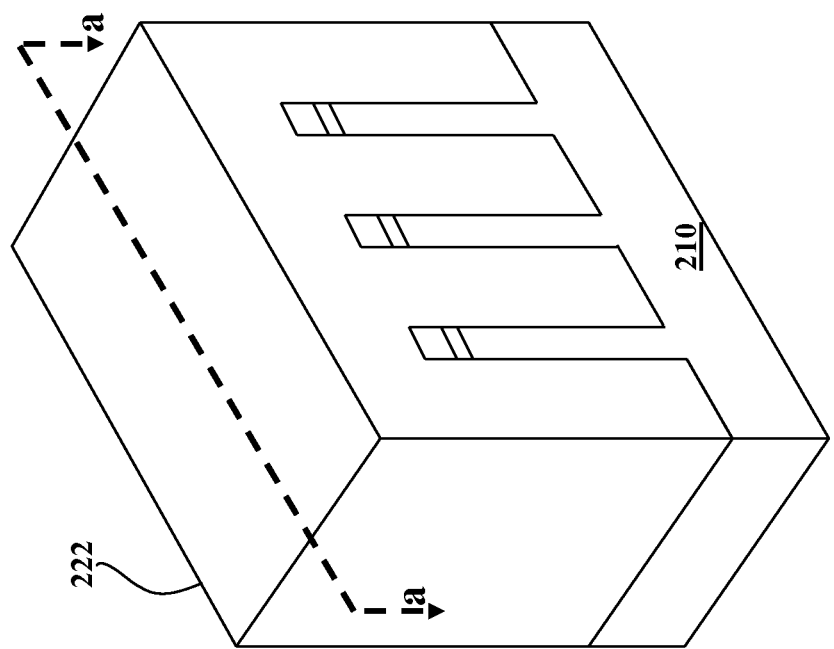

Referring to FIGS. 14A and 14B, deposited over the substrate 210 is an insulation material 222. In the present embodiment, the insulation material 222 defined in the 3D capacitor 400 is substantially similar to the insulation material 222 of the 3D capacitor 200 in terms of composition, formation and configuration. In an alternative embodiment, they are different.

Figure 15B:
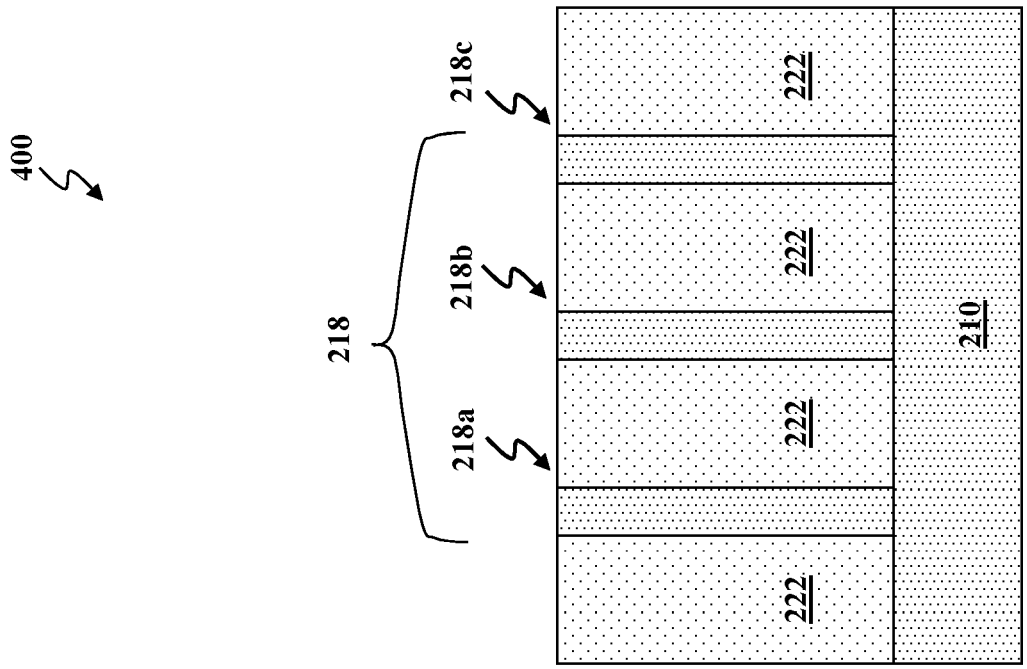
Figure 15A:
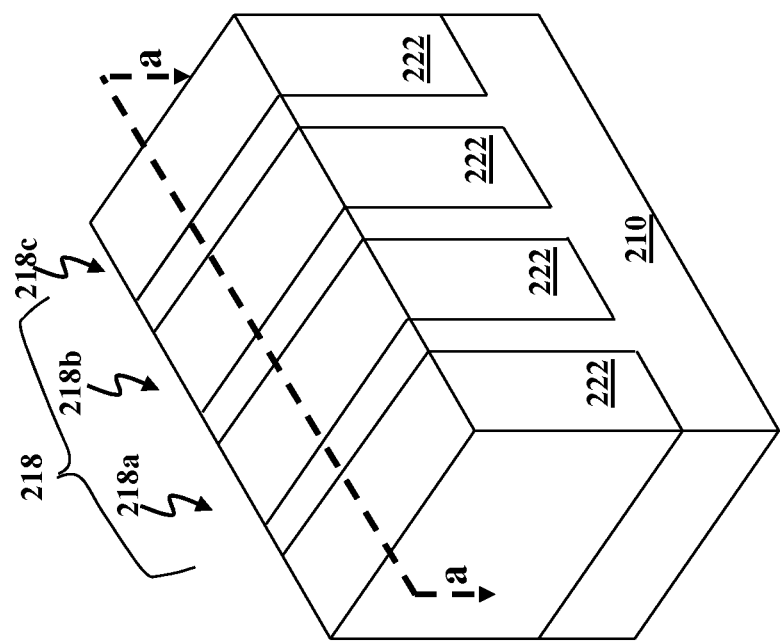

Referring to FIGS. 15A and 15B, a planarizing process is performed on the 3D capacitor 200. In one embodiment, the planarizing process includes a chemical mechanical polishing (CMP) process applied to the 3D capacitor 200 to remove excessive portions of the insulation material 222. The planarizing process may be performed such that the insulation material 222, the dielectric layer 212, and the hard mask 214 are removed, thus exposing a top surface of each fin 218a,b,c, of the fin structure 218.

Figure 16B:
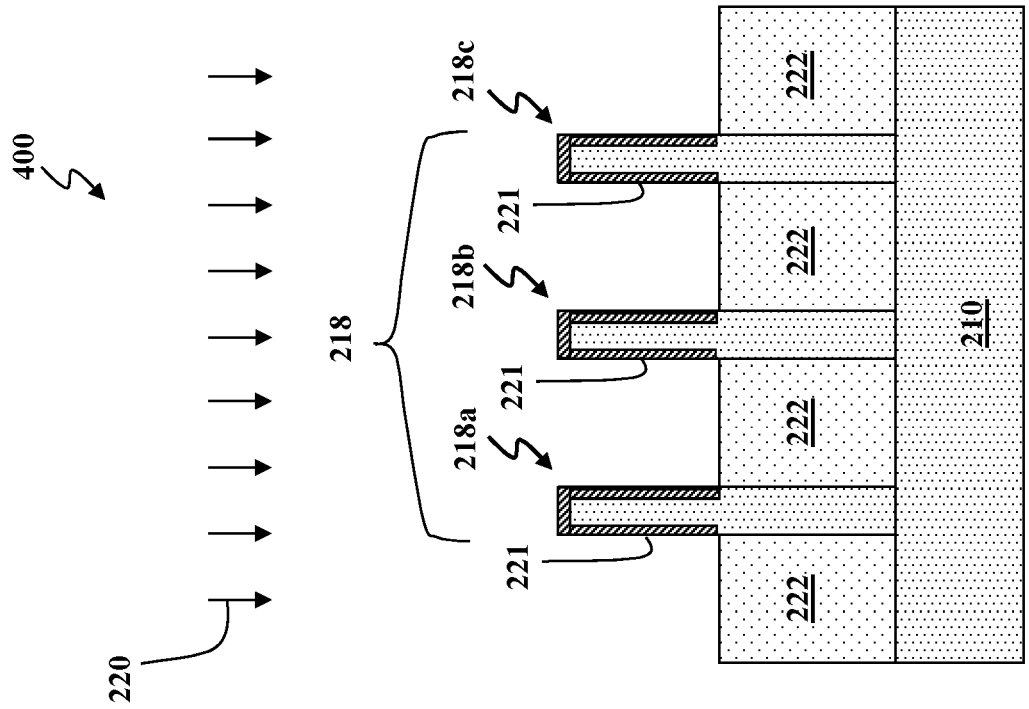
Figure 16A:
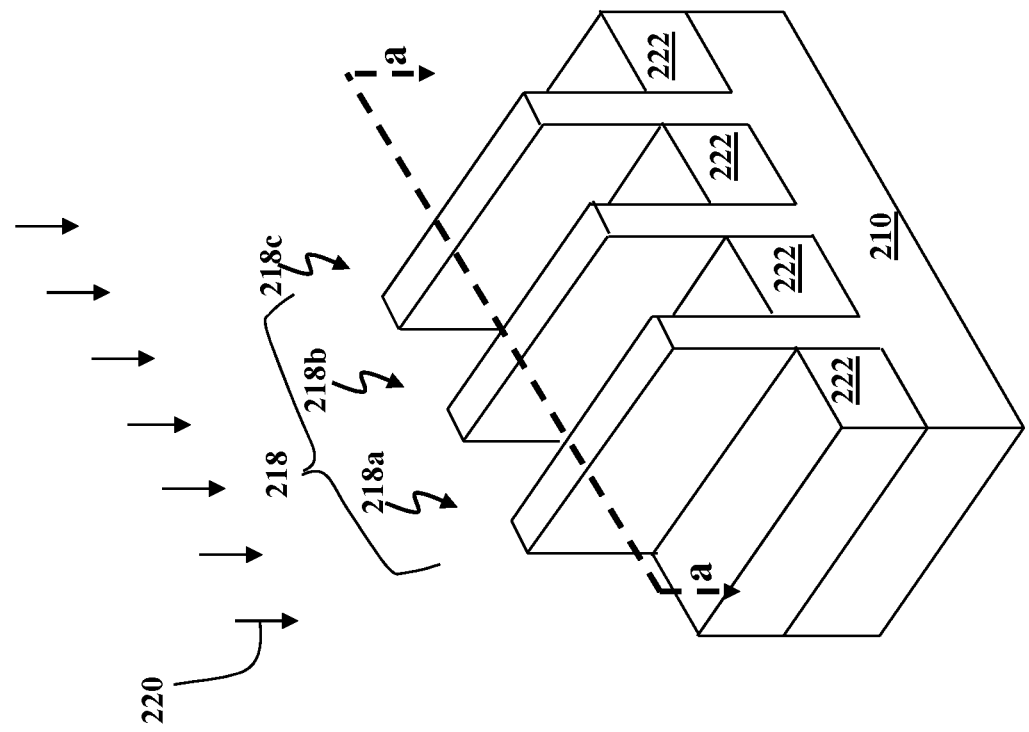

Referring to FIGS. 16A and 16B, an etching process is used to etch-back excessive insulation material 222 between each fin 218a,b,c of the fin structure 218, thereby exposing first and second sidewalls of each fin of the fin structure 218. In the present embodiment, the etching process that is used to etch-back excessive insulation material 222 of 3D capacitor 400 is substantially similar to the etching process that is used to etch-back excessive insulation material 222 of 3D capacitor 200. In an alternative embodiment, they are different.

Referring to FIGS. 16A and 16B, an implantation process 220 is performed on the 3D capacitor 400 to implant the fin structure 218 and thereby form a low-resistance surface 221 on the fin structure 218. In the present embodiment, the implantation process 220 that is used to implant the fin structure 218 of 3D capacitor 400 is substantially similar to the implantation process 220 that is used to implant the fin structure 218 of 3D capacitor 200. In an alternative embodiment, they are different.

Figure 17B:
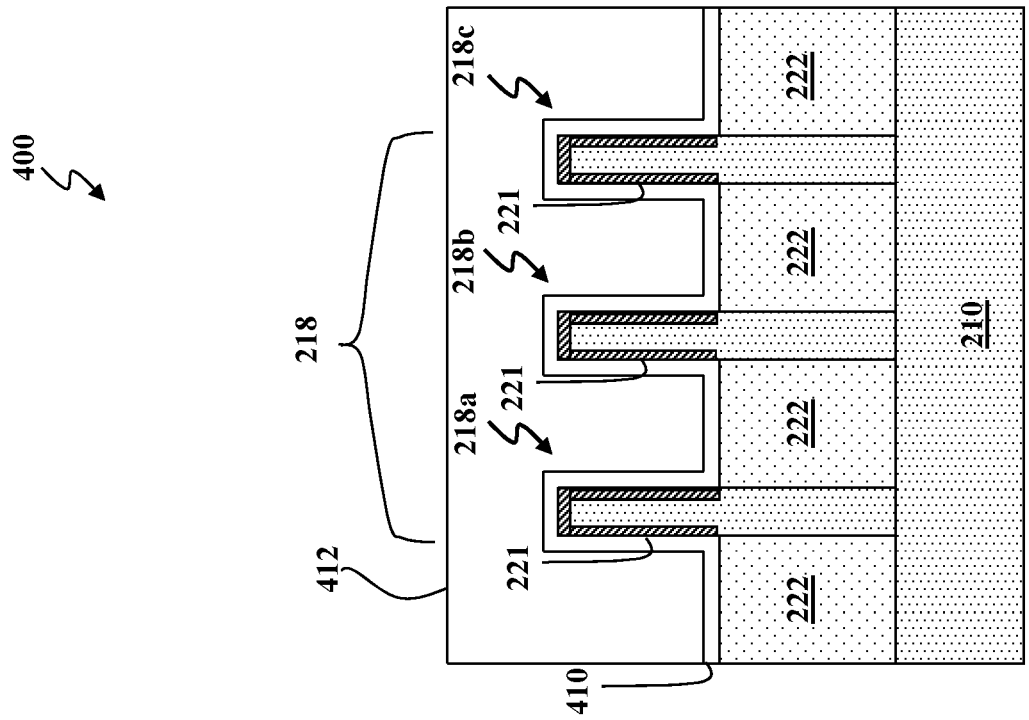
Figure 17A:
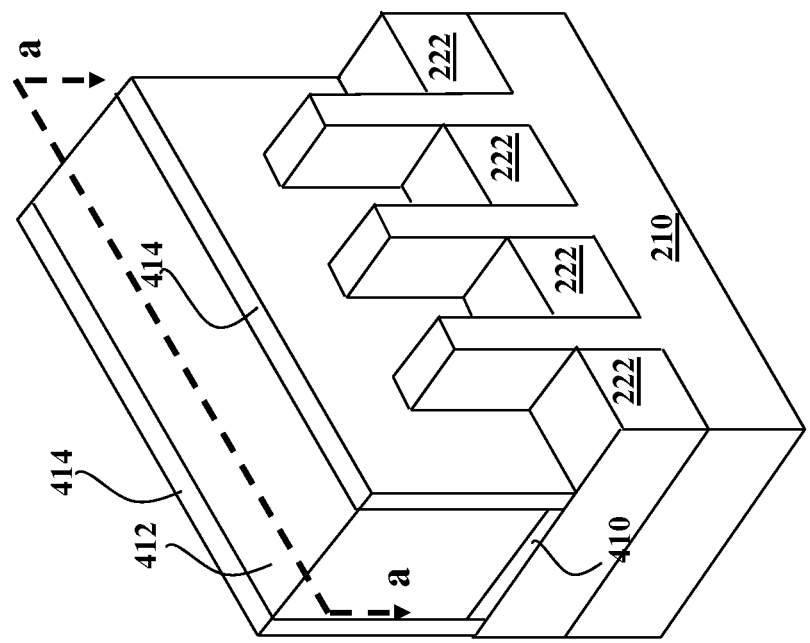

Referring to FIGS. 17A and 17B, the 3D capacitor 400 includes a dielectric layer 410. The dielectric layer 410 traverses the fin structure 218. In some embodiments, the dielectric layer 410 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the dielectric layer 410 is a high-k dielectric layer comprising $HfO_x$. The dielectric layer 410 may be formed using a suitable process such as atomic layer deposition (ALD), chemical vapor deposition (CVD), physical vapor deposition (PVD), thermal oxidation, UV-ozone oxidation, or combinations thereof. The dielectric layer 410 may further comprise an interfacial layer (not shown) to reduce damage between the dielectric layer 410 and the substrate 210 and/or fin structure 218. The interfacial layer may comprise silicon oxide.

Still referring to FIGS. 17A and 17B, the 3D capacitor 400 further includes a first electrode 412 formed on a first portion of the fin structure 218. In the illustrated embodiment, the first portion includes a portion of fins 218a,b,c. The first electrode 412 includes, for example, a conductive material such as Al, Cu, and W, other suitable conductive materials, or combinations thereof. The first electrode 412 may be formed by any suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

With further reference to FIGS. 17A and 17B, the 3D capacitor 400 also includes spacers 414 formed on two sidewalls of the first electrode 412. The spacers 414 traverse each fin 218a,b,c of the fin structure 218. The spacers 414 are formed by a suitable process to a suitable thickness. For example, a dielectric layer, such as a silicon oxide layer, is blanket deposited over the 3D capacitor 400; and then, the silicon oxide layer is etched to remove the silicon oxide layer to form spacers 414 as illustrated in FIGS. 17A and 17B. Alternatively, the spacers 414 include another dielectric material, such as silicon nitride, silicon oxynitride, or combinations thereof.

Figure 18B:
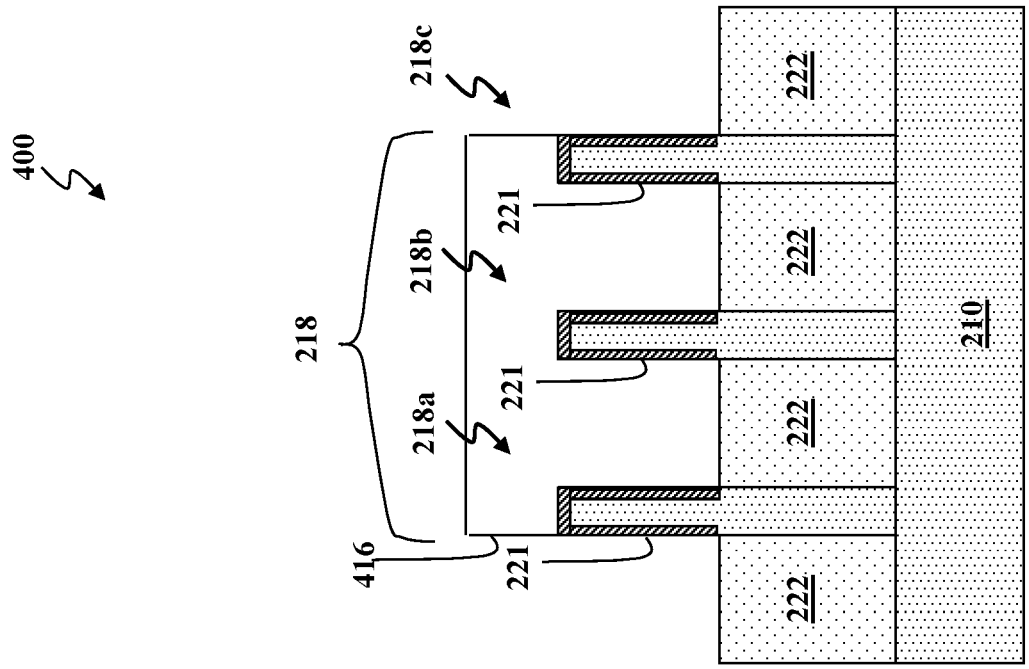
Figure 18A:
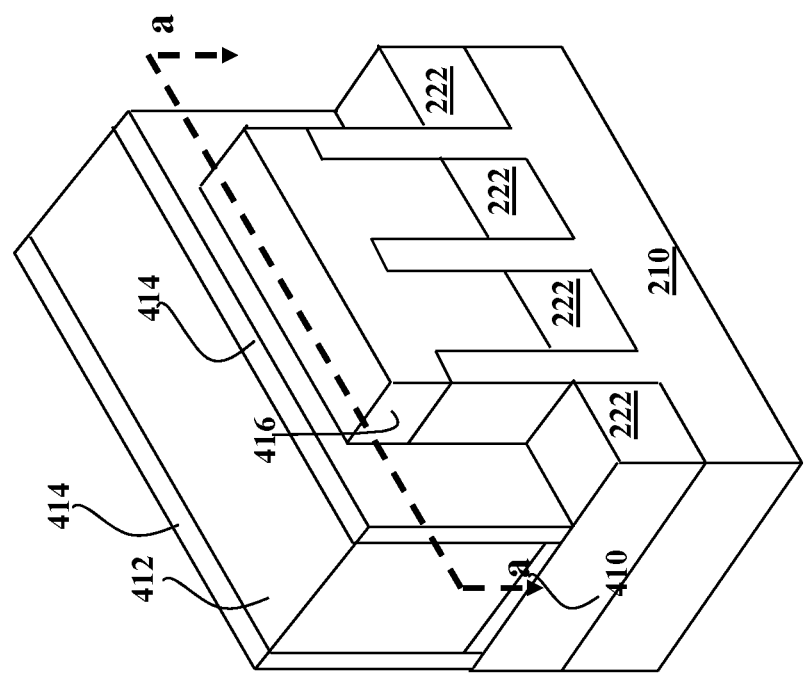

Referring to FIGS. 18A and 18B, the 3D capacitor 400 includes a second electrode 416 formed on a second portion of the fin structure 218. As illustrated, The first portion (that includes the first electrode 412) and second portion (that includes the second electrode 416) of fin structure 218 are different. In the illustrated embodiment, the second portion includes a portion of fins 218a,b,c. The second electrode 416 includes, for example, a conductive material such as Al, Cu, and W, other suitable conductive materials, or combinations thereof. The second electrode 416 may be formed by any suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

As illustrated in FIGS. 18A and B, the 3D capacitor 400 comprises a substrate 210 including a fin structure 218 including a plurality of fins 218a,b,c. Although the current embodiment illustrates three fins (218a,b,c) more/less fins are contemplated. The fin structure 218 includes a low-resistance surface 221 on a portion of the sidewalls of each fin 218a,b,c, of the fin structure. The low-resistance surface 221 is formed on the top portion/layer of the fin structure 218. The 3D capacitor 400 further includes an insulating material 222 disposed in a region between each fin 218a,b,c of the fin structure 218 on the substrate 210. Formed over a first portion of the fin structure 218 including the low-resistance surface 221 is a dielectric layer 410. The dielectric layer 410 traverses each fin 218a,b,c of the fin structure 218. Formed over the dielectric layer 410 is a first electrode 412. The first electrode 412 traverses each fin 218a,b,c of the fin structure 218 and is isolated from the fin structure 218 by the dielectric layer 410. Formed on the sidewalls of the first electrode 412 and on a portion of each fin 218a,b,c of the fin structure 218 are spacers 414 which serve to isolate the first electrode 412 from the second electrode 416, which is formed on the opposing side of one of the spacers 414. The second electrode 416 is formed on a portion of the fin structure 218 and traverses a plurality of fins 218a,b,c. In the illustrated embodiment, the second electrode 416 is formed directly on the low-resistance surface 221 of the plurality of fins 218a,b,c of the fin structure 218, such that a current can pass between the second electrode 416 and the fin structure 218 through the low-resistance surface 221. Further the second electrode is formed on the insulating material 222 in the region between each fin 218a,b,c, of the fin structure 218. The second electrode 416 includes a surface that is in direct contact with a surface of the spacers 414. The first and second electrodes 412, 416 are formed such that they are parallel one to the other and on at least one common fin (e.g., fins 218a,b,c) of the fin structure 218. The first and second electrodes 412, 416 are isolated one from the other.

The embodiment of FIGS. 18A and 18B provides for a metal insulator metal (MIM) capacitor and a metal insulator semiconductor (MIS) capacitor. As illustrated, the first electrode 412 and the second electrode 416 being separated by spacer 414 provide for a MIM capacitor. Further, the first electrode 412 and the substrate 210 including the fin structure 218 being separated by the dielectric layer 410 provide for a MIS capacitor. It is understood that although the 3D capacitor 400 is illustrated in FIGS. 18A and 18B with only three fins, the 3D capacitor 400 may include one or more fins, depending upon design requirements. Further, it is understood that although in the illustrated embodiment, the first and second electrodes have all fins in common (i.e., they are depicted as sharing each and every fin of the fin structure) in certain embodiments, the first and second electrodes may have no fins in common or only some fins in common, depending on design requirements.

The 3D capacitor 200, 400 may include additional features, which may be formed by subsequent processing. For example, various contacts/vias/lines and multilayer interconnect features (e.g., metal layers and interlayer dielectrics) may be formed over the substrate 210, configured to connect the various features or structures of the 3D capacitor 200, 400. The additional features may provide electrical interconnection to the 3D capacitor 200, 400. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The 3D capacitors 200, 400 can be used for various functions such as for decoupling capacitance and high-frequency noise filters in mixed-signal applications, for decoupling capacitance in microprocessor applications, for storage retention in memory applications, and for oscillators, phase-shift networks, bypass filters, and coupling capacitance in radio frequency (RF) applications. It is understood that the 3D capacitors 200, 400 are included in a semiconductor device/integrated circuit that includes other features and structures such as transistors, inductors, passivation layers, bonding pads, and packaging, but the illustrated embodiments are simplified for the sake of simplicity and clarity.

Thus, provided is a 3D capacitor. An exemplary 3D capacitor includes a substrate including a fin structure, the fin structure including a plurality of fins. The 3D capacitor further includes an insulation material disposed on the substrate and between each of the plurality of fins. The 3D capacitor further includes a dielectric layer disposed on each of the plurality of fins. The 3D capacitor further includes a first electrode disposed on a first portion of the fin structure. The first electrode being in direct contact with a surface of the fin structure. The 3D capacitor further includes a second electrode disposed on a second portion of the fin structure. The second electrode being disposed directly on the dielectric layer and the first and second portions of the fin structure being different.

In some embodiments, the dielectric layer is disposed on the insulation material and between each of the plurality of fins of the fin structure. In certain embodiments, the first portion includes a first fin of the plurality of fins of the fin structure, the second portion includes second and third fins of the plurality of fins of the fin structure, and the first, second, and third fins are each different fins. In various embodiments, the first electrode is disposed in a central region of the first fin, and the second electrode is disposed along the length of the second and third fins. In further embodiments, the first electrode is on a different fin than the second electrode. In some embodiments, the first portion includes only one fin of the plurality of fins, the second portion includes more than one fin of the plurality of fins, and the first and second portions do not have any fins in common. In various embodiments, the first and second electrodes include a material selected from the group consisting of Al, Cu, and W.

Also provided is a alternative embodiment of a 3D capacitor. The exemplary 3D capacitor includes a semiconductor substrate and a fin structure including one or more fins formed on the semiconductor substrate. The 3D capacitor further includes an insulator material formed between each of the one or more fins. The 3D capacitor further includes a dielectric layer formed on a first portion of the fin structure and a first electrode formed on the dielectric layer. The 3D capacitor further includes spacers formed on sidewalls of the first electrode. The first and second portions are different. The second electrode includes a surface that is in direct contact with a surface of the spacers.

In some embodiments, the semiconductor substrate is a bulk silicon substrate. In certain embodiments, the second electrode is formed directly on the fin structure and directly on the insulating material. In various embodiments, the first electrode traverses each of the one or more fins, and the second electrode traverses each of the one or more fins. In some embodiments, the semiconductor substrate and the fin structure include silicon.

Also provided is a method of forming a 3D capacitor. The method includes providing a substrate and forming a fin structure including one or more fins on the substrate. The method further includes depositing an insulation material on the substrate and on the fin structure. The insulation material substantially filling a region between each of the one or more fins. The method further includes removing a portion of the insulation material from the region between each of the one ore more fins such that a portion of each of the one or more fins is exposed. The method further includes forming a dielectric layer over each of the one or more fins. The method further includes forming a first electrode on a first portion of the fin structure and forming a second electrode on a second portion of the fin structure. The first and second portions are different and the first and second electrodes are isolated one from the other.

In some embodiments, the method further includes after forming the fin structure and before depositing the insulation material, implanting the fin structure such that the fin structure has a low-resistance surface, wherein forming the first electrode includes forming the first electrode such that the first electrode has direct contact with the low-resistance surface of the fin structure, wherein forming the second electrode includes forming the second electrode on the dielectric layer such that the second electrode does not have direct contact with the low-resistance surface of the fin structure, and wherein the first and second electrodes do not share a common fin. In various embodiments, the method further includes after forming the fin structure and before depositing the insulation material, implanting the fin structure such that the fin structure has a low-resistance surface, wherein the first portion includes a first fin of the one or more fins of the fin structure, wherein the second portion includes second and third fins of the one or more fins of the fin structure, and wherein the first, second, and third fins are each different fins. The method further includes after removing a portion of the insulation material from the region between each of the one ore more fins, implanting the fin structure such that the fin structure has a low-resistance surface, wherein forming the first electrode includes forming the first electrode such that the first electrode has direct contact with the low-resistance surface of the fin structure, wherein forming the second electrode includes forming the second electrode on the dielectric layer such that the second electrode does not have direct contact with the low-resistance surface of the fin structure, and wherein the first and second electrodes do not share a common fin. In certain embodiments, the method further includes after removing a portion of the insulation material from the region between each of the one ore more fins, implanting the fin structure such that the fin structure has a low-resistance surface, and forming spacers on sidewalls of the first electrode, wherein the second electrode includes a surface that is in direct contact with a surface of the spacers.

In some embodiments, forming the first electrode includes forming the first electrode such that each of the one or more fins are traversed, and forming the second electrode includes forming the second electrode such that each of the one or more fins are traversed. In various embodiments, forming the first electrode includes forming the first electrode directly on the dielectric layer and in the region between each of the one or more fins, and forming the second electrode includes forming the second electrode directly on the low-resistance surface of the fin structure and in the region between each of the one or more fins. In certain embodiments, forming the second electrode includes forming the second electrode directly on the insulation material in the region between each of the one or more fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a three-dimensional (3D) capacitor, comprising:
   providing a substrate;
   forming a fin structure including one or more fins on the substrate;
   implanting the fin structure to form a low-resistance surface on the fin structure;
   depositing an insulation material on the substrate and on the fin structure, the insulation material substantially filling a region between each of the one or more fins;
   removing a portion of the insulation material from the region between each of the one or more fins such that a portion of each of the one or more fins is exposed;
   forming a dielectric layer over each of the one or more fins;
   forming a first electrode on a first portion of the fin structure; and
   forming a second electrode on a second portion of the fin structure,
   wherein the first and second portions are different, and
   wherein the first and second electrodes are isolated one from the other.

2. The method of claim 1, wherein the implanting of the fin structure is performed before the depositing of the insulation material.

3. The method of claim 1, wherein the implanting of the fin structure is performed after the depositing of the insulation material and the removing of the portion of the insulation material.

4. The method of claim 1, wherein the first electrode is formed in direct contact with the low-resistance surface on the first portion of the fin structure.

5. The method of claim 1, wherein the implanting of the fin structure includes implanting boron, phosphorous, or arsenic into the fin structure.

6. The method of claim 1, before the removing of the portion of the insulation material, performing a planarizing process to the insulation material.

7. The method of claim 1, wherein the dielectric layer includes a high-k dielectric material.

8. A method of manufacturing a three-dimensional (3D) capacitor, comprising:
   providing a substrate;
   forming a fin structure including one or more fins on the substrate;
   depositing an insulation material on the substrate and on the fin structure, the insulation material substantially filling a region between each of the one or more fins;
   planarizing the insulation material;
   removing a portion of the insulation material such that a portion of each of the one or more fins is exposed;
   implanting the fin structure to form a low-resistance surface on the fin structure;
   depositing a dielectric layer over each of the one or more fins and over the insulation material;
   forming a first electrode over a first portion of the fin structure; and
   forming a second electrode over a second portion of the fin structure,
   wherein the first and second portions of the fin structure are different, and
   wherein the first and second electrodes are isolated one from the other.

9. The method of claim 8, wherein the implanting is performed after forming the fin structure and before depositing the insulation material,
   wherein forming the first electrode includes forming the first electrode such that the first electrode has direct contact with the low-resistance surface of the fin structure,
   wherein forming the second electrode includes forming the second electrode on the dielectric layer such that the second electrode does not have direct contact with the low-resistance surface of the fin structure, and
   wherein the first and second electrodes do not share a common fin.

10. The method of claim 8, wherein the implanting is performed after forming the fin structure and before depositing the insulation material,
    wherein the first portion includes a first fin of the one or more fins of the fin structure,
    wherein the second portion includes a second fin of the one or more fins of the fin structure, and
    wherein the first and second fins are different fins.

11. The method of claim 8, wherein the implanting is performed after removing the portion of the insulation material,
    wherein forming the first electrode includes forming the first electrode such that the first electrode has direct contact with the low-resistance surface of the fin structure, and
    wherein forming the second electrode includes forming the second electrode on the dielectric layer such that the second electrode does not have direct contact with the low-resistance surface of the fin structure.

12. The method of claim 8, wherein the implanting is performed after removing the portion of the insulation material, further comprising:
    forming spacers on sidewalls of the first electrode,
    wherein the second electrode includes a surface that is in direct contact with a surface of the spacers.

13. The method of claim 12, wherein forming the first electrode includes forming the first electrode such that each of the one or more fins is traversed, and
    wherein forming the second electrode includes forming the second electrode such that each of the one or more fins is traversed.

14. The method of claim 13, wherein forming the first electrode includes forming the first electrode directly on the dielectric layer and in the region between each of the one or more fins, and
    wherein forming the second electrode includes forming the second electrode directly on the low-resistance surface of the fin structure and in the region between each of the one or more fins.

15. The method of claim 14, wherein forming the second electrode includes forming the second electrode directly on the insulation material in the region between each of the one or more fins.

16. A method of manufacturing a three-dimensional (3D) capacitor, comprising:
- providing a substrate;
- forming one or more fins on the substrate;
- depositing an insulation material on the substrate and filling a region between each of the one or more fins;
- etching back the insulation material such that a portion of each of the one or more fins is exposed;
- after the etching back, implanting the one or more fins to form a low-resistance surface on the one or more fins;
- after the implanting, forming a dielectric layer over each of the one or more fins above the insulation material;
- forming a first electrode on a first subset of the one or more fins; and
- forming a second electrode on a second subset of the one or more fins,
- wherein the first and second subsets are different portions of same fins.

17. The method of claim 16, wherein the first and second electrodes are isolated from each other.

18. The method of claim 16, wherein the first electrode is formed in direct contact with the low-resistance surface on the first subset of the one or more fins.

19. The method of claim 18, wherein the second electrode is formed to be separate from the low-resistance surface by at least the dielectric layer.

20. The method of claim 16, further comprising:
- forming a spacer between the first and second electrodes.

* * * * *